United States Patent [19]
Ichinose et al.

[11] Patent Number: 5,696,950
[45] Date of Patent: Dec. 9, 1997

[54] FLEXIBLE CLOCK AND RESET SIGNAL GENERATION AND DISTRIBUTION SYSTEM HAVING LOCALIZED PROGRAMMABLE FREQUENCY SYNTHESIZERS

[75] Inventors: Kazushige Ichinose; Masayuki Kikushima; Hideo Karasawa; Tooru Shirotori; Mikio Shigemori, all of Suwa, Japan

[73] Assignee: Seiko Epson Corporation, Tokyo, Japan

[21] Appl. No.: 221,680

[22] Filed: Mar. 31, 1994

[30] Foreign Application Priority Data

Sep. 29, 1993 [JP] Japan .................. 5-242790
Oct. 18, 1993 [JP] Japan .................. 5-260173
Jan. 24, 1994 [JP] Japan .................. 6-005926

[51] Int. Cl.⁶ .................................. G06F 1/08
[52] U.S. Cl. .................................. 395/556
[58] Field of Search .................. 395/550, 556; 302/66; 364/270–270.4; 327/141, 145, 291; 331/60, 172, 177 R

[56] References Cited

U.S. PATENT DOCUMENTS

| | | | |
|---|---|---|---|
| 3,855,484 | 12/1974 | Van Essen et al. | 307/296 |
| 4,013,902 | 3/1977 | Payne | 307/268 |
| 4,296,338 | 10/1981 | Thomas | 307/362 |
| 4,451,742 | 5/1984 | Aswell | 307/66 |
| 4,617,473 | 10/1986 | Bingham | 307/66 |
| 4,803,702 | 2/1989 | Chen et al. | 375/106 |
| 4,893,271 | 1/1990 | Davis et al. | 364/900 |
| 5,095,280 | 3/1992 | Wunner et al. | 328/63 |
| 5,133,064 | 7/1992 | Hotta et al. | 395/550 |
| 5,159,217 | 10/1992 | Mortensen et al. | 302/597 |
| 5,261,082 | 11/1993 | Ito et al. | 395/550 |
| 5,267,189 | 11/1993 | Wilke | 364/851 |
| 5,291,528 | 3/1994 | Vermeer | 325/106 |
| 5,355,098 | 10/1994 | Iwasaki | 331/14 |
| 5,388,249 | 2/1995 | Hotta et al. | 395/550 |
| 5,481,573 | 1/1996 | Jacobowitz | 375/356 |
| 5,485,111 | 1/1996 | Tanimoto | 327/143 |
| 5,511,209 | 4/1996 | Mensch, Jr. | 395/550 X |

FOREIGN PATENT DOCUMENTS

| | | | |
|---|---|---|---|
| A-36 36 852 | 6/1987 | Germany | G06F 1/00 |
| A-40 22 887 | 2/1991 | Germany | H02J 9/06 |
| 20223 | 2/1985 | Japan . | |
| 140812 | 5/1992 | Japan . | |
| 4140812 | 5/1992 | Japan | G06F 1/12 |

OTHER PUBLICATIONS

Dallas Semiconductor IC chips DS1585/DS1587–Serialized Real Time Clocks, pp. 6–229 to 6–253 (Feb. 6, 1992).

"32 kHz Motherboard Frequency Generator", Specification Sheet for ICS9132, Integrated Circuit Systems, Inc., p. 1 (Mar. 1993).

*Primary Examiner*—Thomas M. Heckler
*Attorney, Agent, or Firm*—W. Glen Johnson

[57] ABSTRACT

A flexible clock and reset signal generation and distribution system and method for distributing a relatively low frequency clock signal to various elements of a computer system that require higher frequency clock signals for operation and includes programmable frequency synthesizers containing phase locked loop (PLL) type frequency multipliers, which are located physically adjacent to the computer system elements for receiving the low frequency clock signal and generating the various required higher frequency clock signals. The source of the relatively low frequency clock signal is a real-time clock (RTC) module having a crystal oscillator, a reset signal generator, and a low voltage detector. The RTC module switches off the low frequency clock signal when the main system power supply falls below a prescribed voltage level, such as, a battery voltage, or a voltage reference, or a combination battery voltage and voltage reference. Further, the RTC module provides a system reset signal that is asserted a predetermined delay time after the low frequency clock signal is provided.

10 Claims, 11 Drawing Sheets

| S0 | S1 | S2 | OUTPUT FREQUENCY |
|----|----|----|------------------|
| 0 | 0 | 0 | 1.843MHz |
| 0 | 0 | 1 | 14.318MHz |
| 0 | 1 | 0 | 16.0MHz |
| 0 | 1 | 1 | 24.0MHz |
| 1 | 0 | 0 | 40.0MHz |
| 1 | 0 | 1 | 50.0MHz |
| 1 | 1 | 0 | 66.6MHz |
| 1 | 1 | 1 | 80.0MHz |

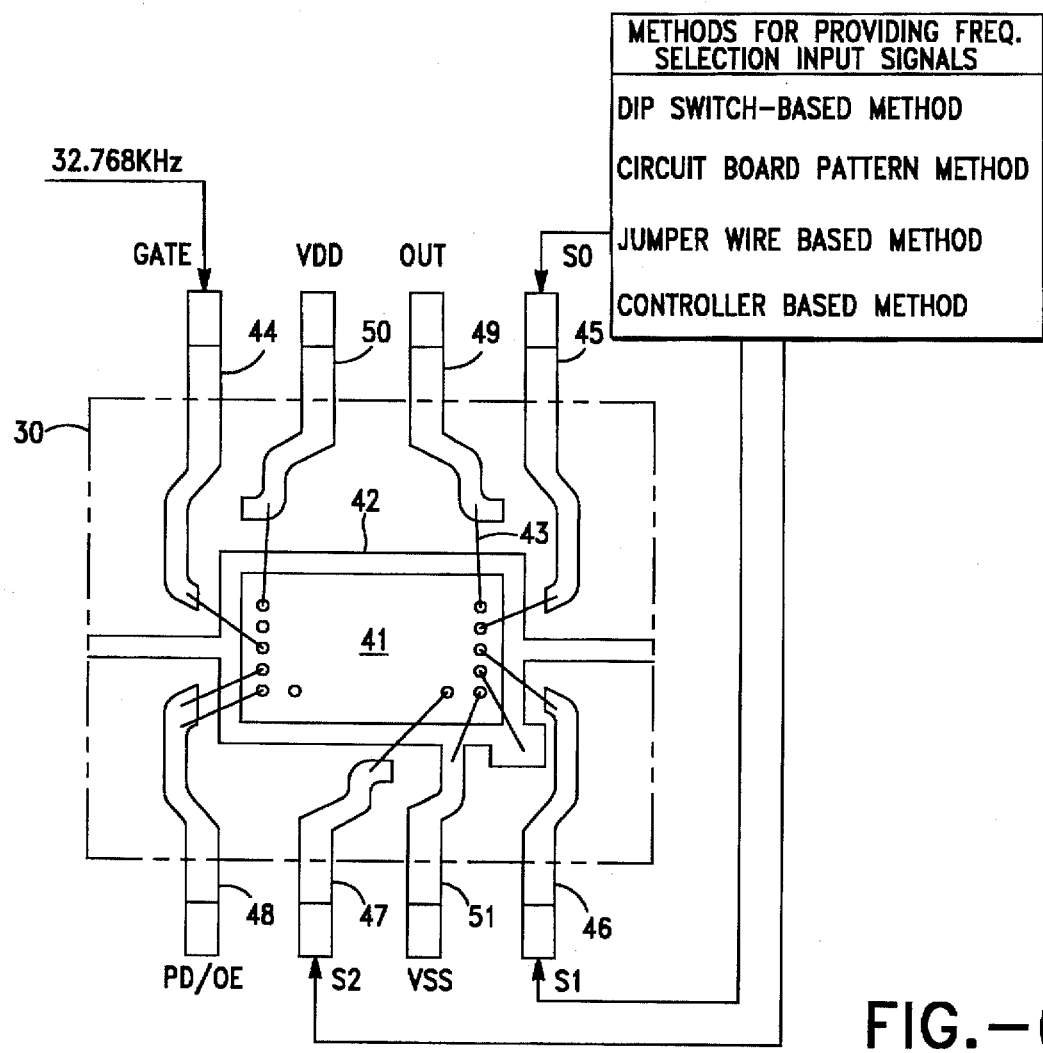
FIG.-6
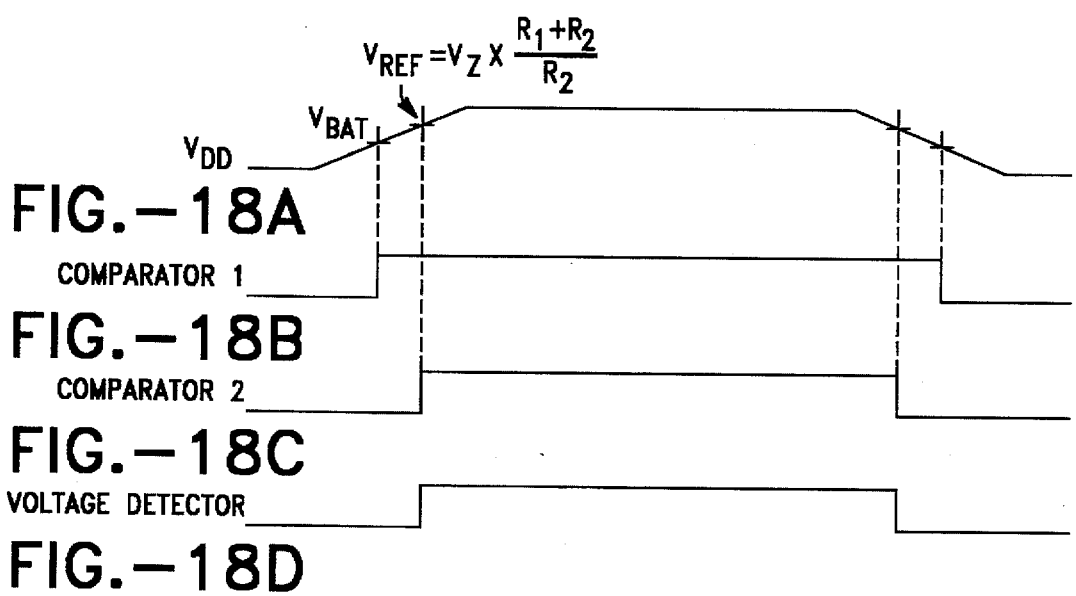
FIG.-18A
FIG.-18B
FIG.-18C
FIG.-18D

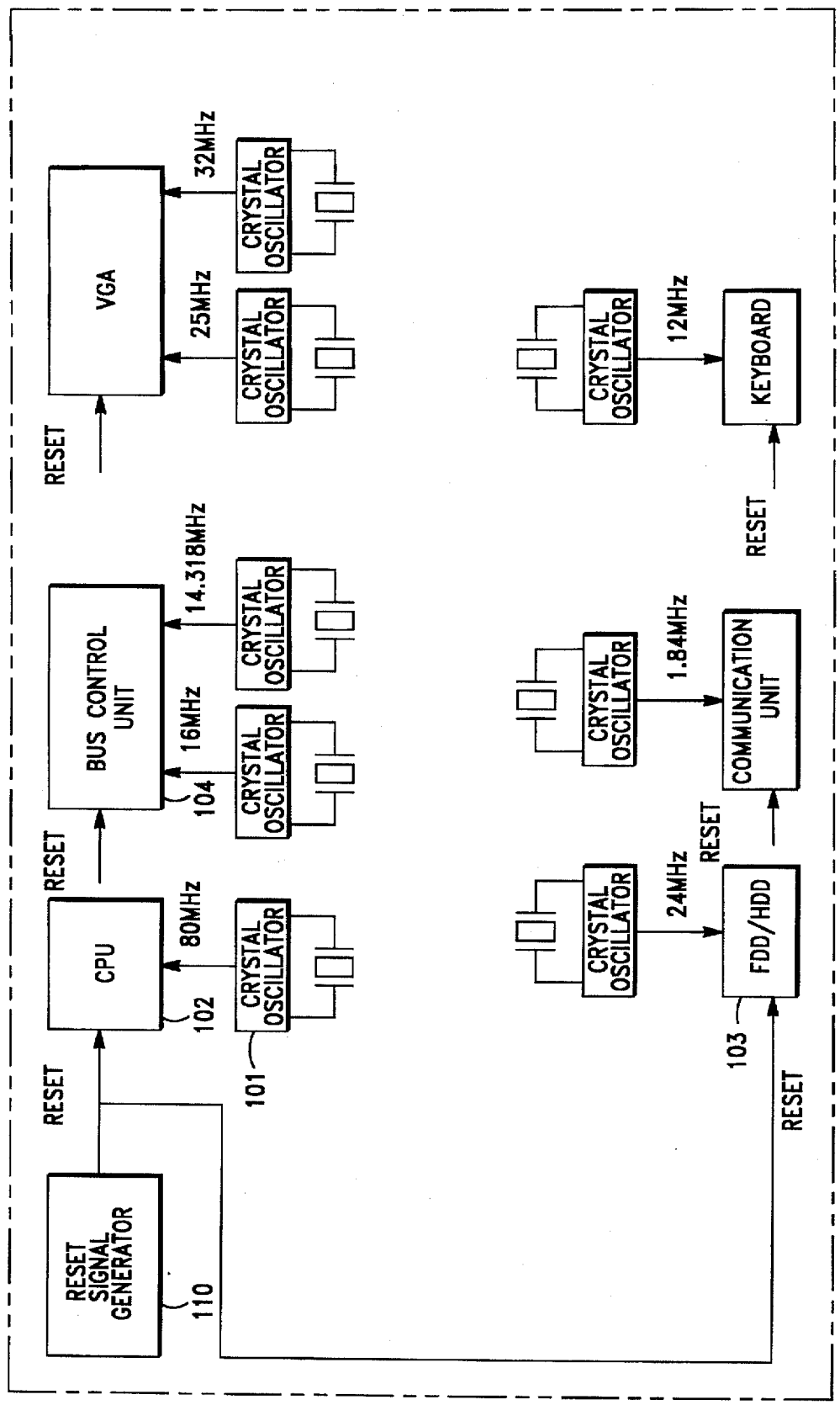
FIG.—9
(PRIOR ART)

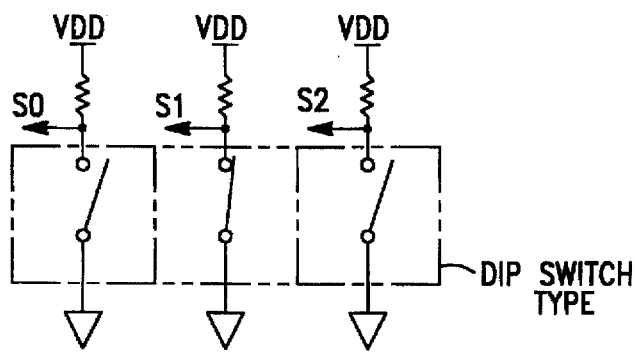
FIG.-12A
| S0 | S1 | S2 |
|----|----|----|
| 1  | 0  | 1  |
FIG.-12B
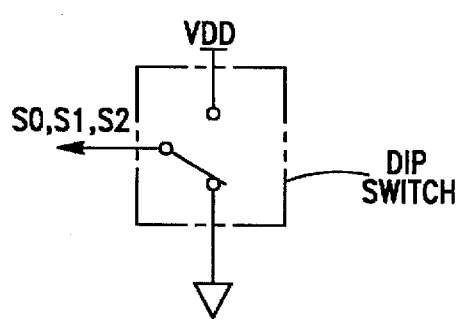
FIG.-12C
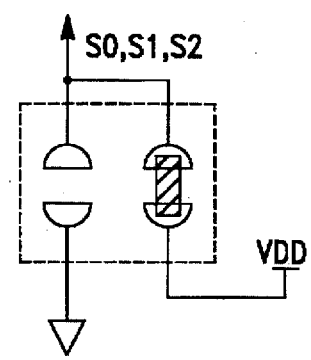
FIG.-14
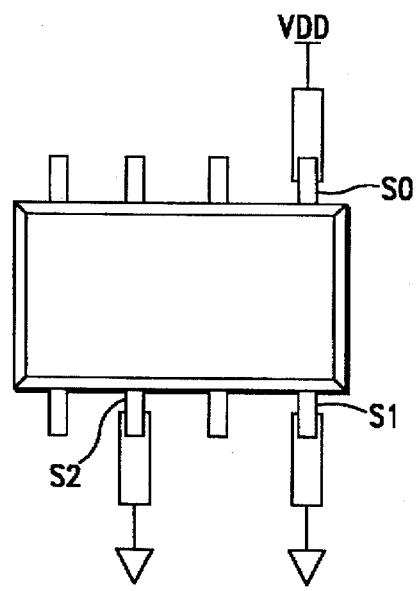
FIG.-13A
| S0 | S1 | S2 |
|----|----|----|
| 1  | 0  | 0  |
FIG.-13B

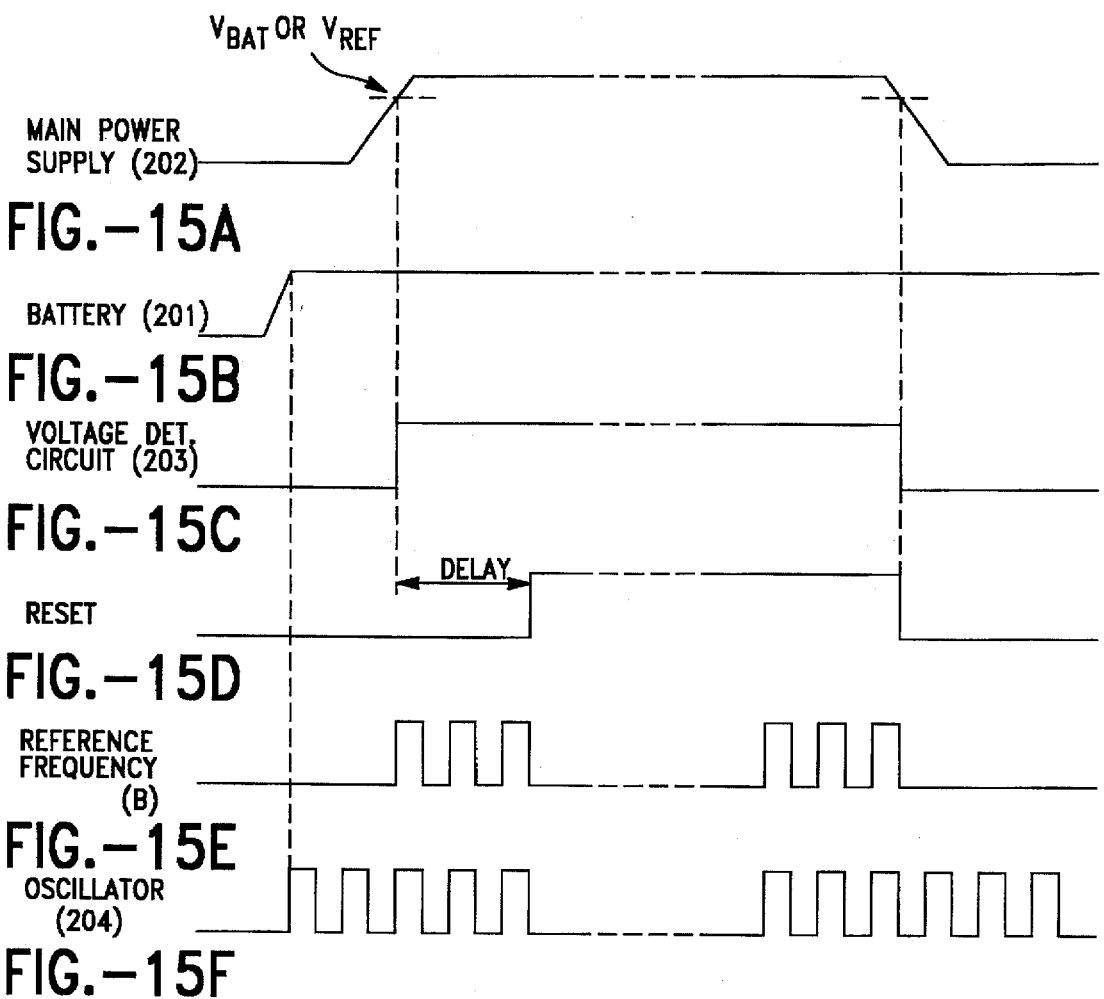
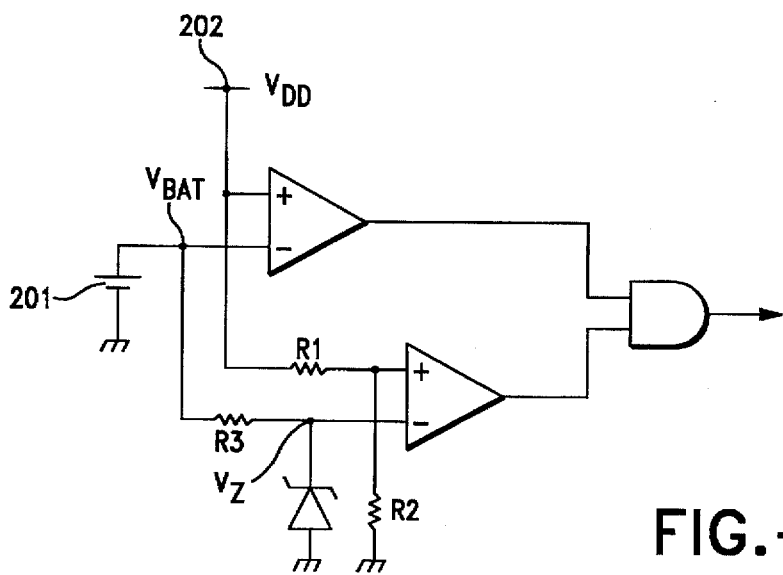
FIG.-17

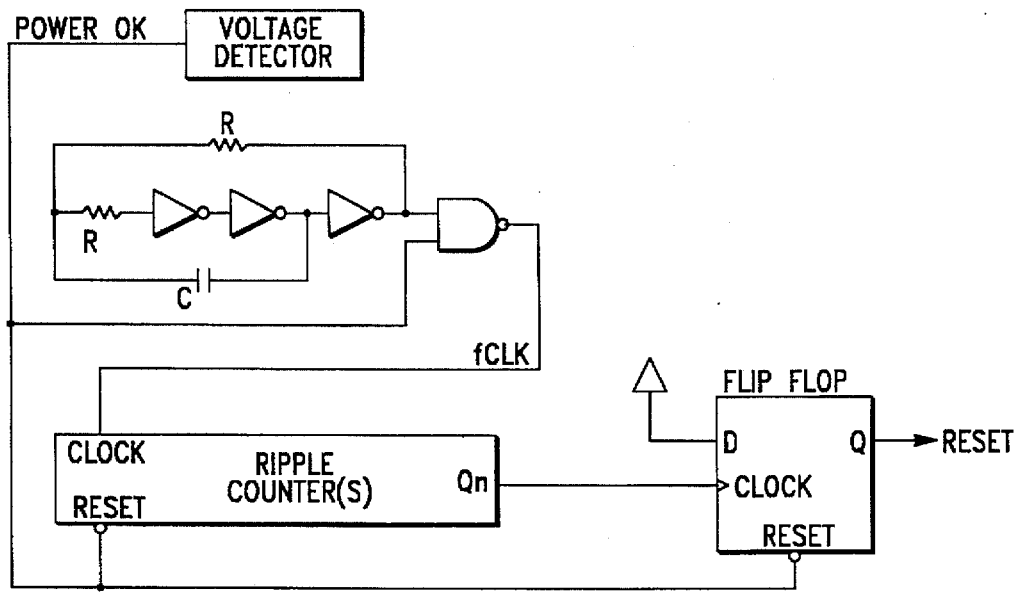
FIG.—16
MAIN POWER
FIG.—19A
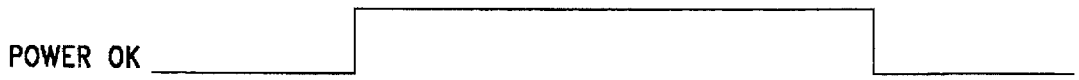
POWER OK
FIG.—19B
fCLK
FIG.—19C
Qn
FIG.—19D
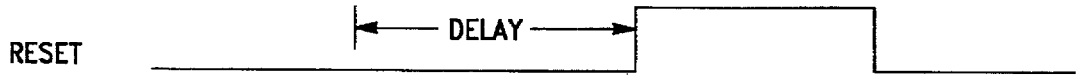
RESET
FIG.—19E

FLEXIBLE CLOCK AND RESET SIGNAL GENERATION AND DISTRIBUTION SYSTEM HAVING LOCALIZED PROGRAMMABLE FREQUENCY SYNTHESIZERS

BACKGROUND OF THE INVENTION

This invention relates to clock supply systems for computers and other types of electronic equipment that are composed of semiconductor ICs and piezoelectric resonators; it also relates to real-time clock modules and clock oscillator that are used in the clock supply systems.

FIG. 9 illustrates a conventional system, such as employed in the IBM PS/2 Model 50 series, that supplies operating clocks for CPUs comprising conventional semiconductor integrated circuits (ICs) and piezoelectric resonators. In conventional systems, CMOS-type and other ICs, and quartz oscillators 101 employing quartz crystals and other piezoelectric resonators, are employed as clock signal sources for different frequencies for a CPU 102, a FDD (floppy disk drive)/HDD (hard disk drive) unit 103, or a bus control unit 104. Another conventional system is shown in FIG. 10 wherein a multi-output oscillator 105 employs phase locked loop (PLL) circuits with a quartz crystal 106 so that several frequencies can be obtained. These frequencies are supplied to CPU 107, FDD/HDD unit 108, and bus control unit 109. Systems that employ this scheme are now in widespread use.

FIG. 11 shows a system disclosed in publication of Japanese Laid-Open Patent Publication No. 4-140812, published May 14, 1992, that supplies clocks obtained from a clock generator circuit 121 to ICs 122–125. Each of ICs 122–125 contains a phase locked loop (PLL) circuit 126.

According to the conventional system configurations shown in FIGS. 9 and 10, a reset signal generator circuit 110 supplies reset signals to each of respective CPUs 102, 107, FDD/HDD units 103, 108, and bus control units 104, 109.

In the conventional clock signal supply systems, described above, quartz oscillators are provided by combining a CMOS-type IC and a quartz crystal for use as clock signal sources. As a result, a quartz oscillator is required for each of the clocks utilized in the system. This imposes considerable cost and size limitations on products employed this kind of system. Further, these systems require AT-cut quartz crystals. These crystals are expensive, especially in the higher frequency range from 40 MHz to 80 MHz. This drives up the cost of quartz oscillators that incorporate AT-cut quartz crystals.

In the supply method based on a multi-output oscillator using a PLL circuit, the multi-output oscillator is typically laid out in close proximity to the CPU because the CPU typically requires the highest speed clock in the system. Therefore, this layout arrangement requires routing clock lines to the FDD, the HDD, etc. In high-frequency clock signal sources, the presence of these lines causes electromagnetic interference (EMI) noise, which propagates to neighboring circuits. The noise may cause phase-shifted clocks and impulse clocks to enter the phase comparator contained in the PLL. This degrades the purity (i.e., S/N ratio) and reliability of signals provided as output from the voltage controlled oscillator circuit contained in the PLL circuit. It also may cause waveform fluctuations known as phase jitter. Another problem is that the PLL may become unlocked. A further problem is that noise in the form of EMI is likely to propagate outside of the computer system.

In the information processing system proposed in Japanese Laid-Open Patent Publication No. 4-140812, PLL circuits are formed inside semiconductor ICs. This limits the frequency in which the operating clocks for the CPU, memory, or I/O controllers can operate. Therefore, every change in the operating frequency requires the creation of a new semiconductor IC. Further, because PLLs are formed inside each IC without provision for providing the PLL outputs external to that IC, the operating clocks generated by these internal PLLs can only be used internal to the IC that contains that internal PLL. Also, as the frequency of the operating clock is increased, heat generated by the PLL poses a significant problem. This increases the costs of heat dissipation measures that are required in each IC.

Further, conventional systems require separate reset signal generator circuits, such that the timing of the generation of reset signals must match the timing of the entire system. This requires complex and expensive timing adjustments for the circuit.

An object of this invention is a clock supply system that simultaneously supplies and distributes a clock signal of high signal purity to PLL-based frequency synthesizer circuits.

Another object of this invention is a computer system having a plurality of localized programmable PLL-based frequency synthesizers.

A further object of this invention to provide low-cost, small-size real-time clock modules and clock oscillators suitable for use with a plurality of localized programmable PLL-based frequency synthesizers.

SUMMARY OF THE INVENTION

According to this invention, a system and method for distributing a relatively low frequency clock signal to various elements of a computer system that require higher frequency clock signals to operate, includes programmable frequency synthesizers containing phase locked loop (PLL) type frequency multipliers. These local frequency synthesizers receive the low frequency clock signal and generate the various required higher frequency clock signals. The local frequency synthesizer is positioned so that a length of the clock signal line from the local frequency synthesizer to the element is shorter than that of the clock signal line from the low frequency clock source to the local frequency synthesizer. The source of the relatively low frequency clock signal is a real-time clock (RTC) module having a crystal oscillator, a reset signal generator, and a low voltage detector. The RTC switches off the low frequency clock signal when the primary system power supply falls below a prescribed voltage level, such as, a battery voltage, or a voltage reference, or a combination battery voltage and voltage reference. Further, the RTC of the present invention provides a system reset signal that, on power-up, is asserted a predetermined delay time after the low frequency clock signal is provided.

The low voltage detector of the present invention can be implemented to compare the main power supply to a prescribed voltage source or level comprising (i) a battery voltage; (ii) a voltage reference; or (iii) a battery voltage and a voltage reference. In the first case, the low voltage detector provides a signal indicating that the main power supply has reached an acceptable operating level when its voltage is greater than the voltage of a battery included in the system. In the second case, the low voltage detector provides a signal indicating that the main power supply has reached an acceptable operating level when its voltage is greater than the voltage of a voltage reference. In the third case, the low voltage detector provides a signal indicating that the main power supply has reached an acceptable operating level when its voltage is greater than the voltage of a battery included in the system, and greater than the voltage of a voltage reference.

An advantage of the present invention is the ability to provide many clock signals having different frequencies while distributing only one relatively low frequency clock signal throughout the system, thereby reducing radiated electro-magnetic interference.

A further advantage of the present invention is the ability to assert a reset signal a predetermined amount of time after the power supply has reached an acceptable level, and the clocks generated in the system have stabilized.

Other objects, advantages and attainments together with a fuller understanding of the invention will become apparent and appreciated by referring to the following description and claims taken in conjunction with the accompanying drawings.

BRIEF DESCRIPTION OF THE DRAWINGS

FIG. 6 is a structural diagram showing a frequency synthesizer containing a PLL, according to this invention.

FIG. 9 is a system block diagram known in the art.

FIGS. 12A–12C illustrate examples of DIP switch configurations employed in the DIP switch based method of frequency selection.

FIGS. 13A–13B illustrate an example of the circuit board based method of frequency selection.

FIG. 14 illustrate an example of the jumper wire based method of frequency selection.

FIG. 15 shows the relationship between various signals involved in the generation of the RESET signal.

FIG. 16A shows an example of the circuitry employed to determine the delay time between power-up and RESET assertion.

FIG. 17 illustrates a voltage detector circuit for comparing a main power supply voltage to a reference voltage and to a battery voltage.

FIGS. 18A–18D show the relationship between various signals involved in the generation of the voltage detector output of the voltage detector circuit of FIG. 17.

FIGS. 19A–19E show a timing diagram illustrating the operation of the circuit of FIG. 16.

Figure 1:
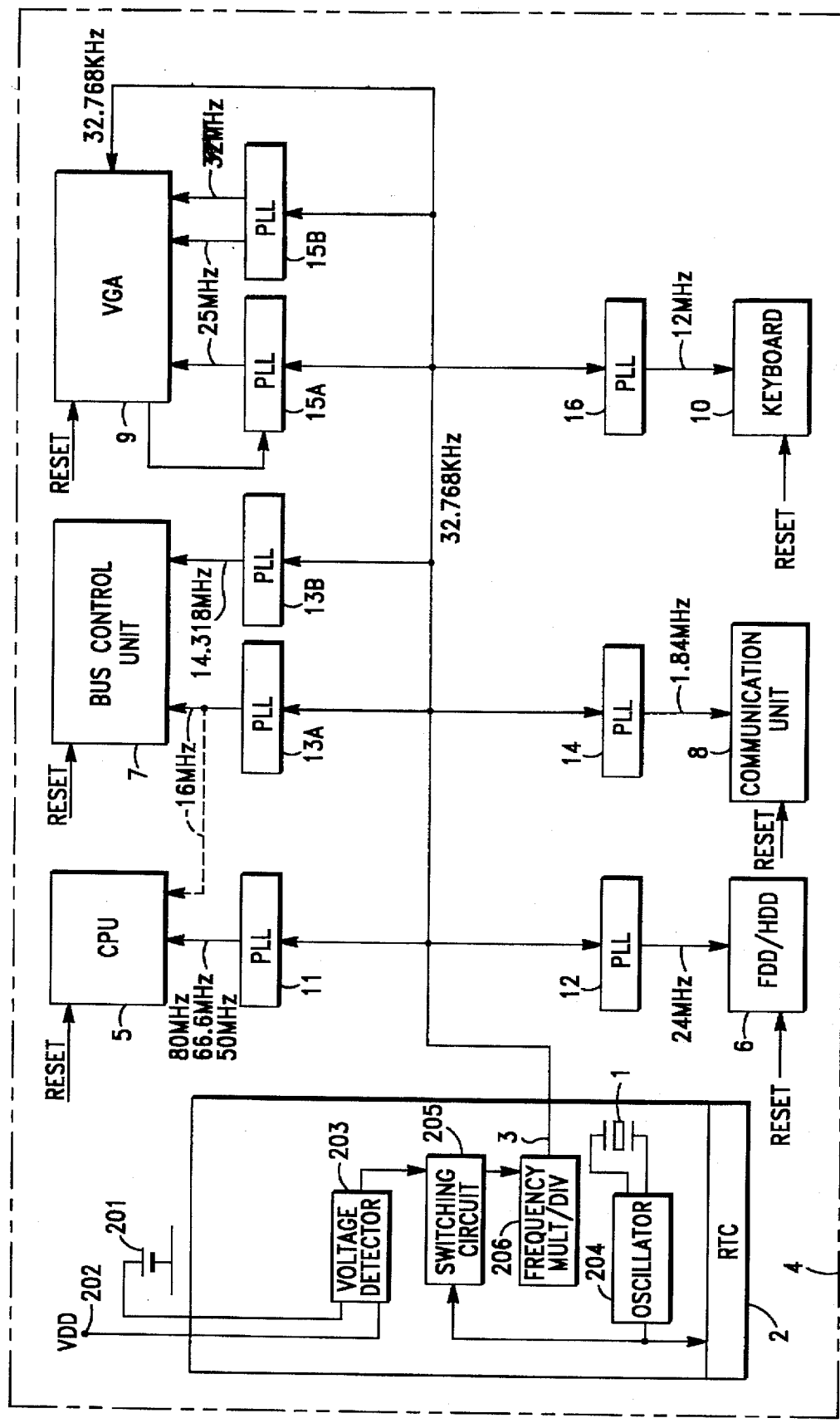
FIG. 1 is a system block diagram illustrating a computer employing an embodiment of this invention.

Appendix I is an index of reference numerals and the elements associated with them.

DESCRIPTION OF THE PREFERRED EMBODIMENTS OF THE INVENTION

The following is an explanation of an embodiment of the clock supply system of this invention, and of the real-time clock module and the clock oscillator that are used in the clock supply system. As used herein, the term IC and chip are interchangeable. An example is described with reference to computer system block diagrams. The example involves a clock supply system in which quartz crystals are used for piezoelectric resonators, in which a real-time clock module and a clock oscillator that oscillates the quartz crystal are placed, and in which several frequency synthesizers containing PLL circuits are placed; such that the clock supply system distributes to frequency synthesizers containing PLL circuits a clock that is output from the output terminals of the real-time clock module and clock oscillator. For the purposes of the present invention, a real-time clock module refers to a module that keeps time and/or calendar information necessary for the operation of computers, and that contains oscillator circuits. Also, a clock oscillator refers to a clock generator that contains an oscillator circuit.

The clock frequency necessary for the generation of reference signals in the PLL circuits is set at a level less than or equal to the system frequency required by each system. Preferably, this frequency is a few MHz, or even less than 100 KHz. The reason for the restriction is that a frequency exceeding this range increases the amount of current consumed by the system. The embodiment given below uses a clock frequency of 32.768 KHz, which is a widely used clock frequency for measuring time and calendar information.

Embodiment 1

FIG. 1 is a block diagram showing the clock supply system of one embodiment of the present invention. It also shows an embodiment of the real-time clock module used in that system. A 32.768 KHz clock is output from output terminal 3 of real-time clock module 2, which has a built-in quartz crystal 1 and generates a 32.768 KHz clock signal. The RTC circuit shown in FIG. 1 measures time and/or calendar information. The clocks that are output from output terminal 3 are distributed through conductors on the circuit board of system 4 to CPU 5, FDD/HDD unit 6, bus control unit 7, communication unit 8, VGA (video graphics array) unit 9, and keyboard unit 10. The clock information is then input into input terminals for frequency synthesizers (denoted in the figure as "PLL") 11, 12, 13a, 13b, 14, 15a, 15b, 16, all containing PLL circuits. These frequency synthesizers are located adjacent to and connected to CPU 5, FDD/HDD unit 6, bus control unit 7, communication unit 8, the VGA unit 9, and keyboard unit 10. The clock signal is then multiplied by frequency synthesizers 11, 12, 13a, 13b, 14, 15a, 15b, 16, to frequencies that are required by CPU 5, FDD/HDD unit 6, bus control unit 7, communication unit 8, VGA unit 9, and keyboard unit 10. The results are output from their respective output terminals. For example, the frequencies required for CPU 5 are 80 MHz, 66.6 MHz, and 50 MHz. These frequencies are produced and output by frequency synthesizer 11. Similarly, the frequency required for FDD/HDD unit 6 is 24 MHz, which is produced and output by frequency synthesizer 12. Likewise, the frequencies required for the bus control unit are 16 MHz and 14.318 MHz, which are produced and output by frequency synthesizers 13a, 13b. Similarly, the frequencies required for communication unit 8, VGA unit 9, and keyboard unit 10 are produced and output by frequency synthesizers 14, 15a, 15b, 16.

Thus, the 32.768 KHz clock is frequency-converted to the 1.843 MHz–80 MHz range by the frequency synthesizers.

Real-time Clock Module

Real-time clock module 2 has a time and/or calendar function. The 32.768 KHz clock frequency of quartz crystal 1 that is built into the real-time clock module is also utilized as a reference clock signal for VGA unit 9 and other components.

Although in this embodiment quartz crystal 1 is built into real-time clock module 2, quartz crystal 1 can also be mounted externally and connected to real-time clock module 2.

Real-time clock module 2 is composed of a voltage detector circuit 203 that compares the voltages of battery 201 with main power supply 202; an oscillator circuit 204, which oscillates quartz crystal 1, a switching circuit 205, which turns the oscillation frequency from oscillator circuit 204 on and off, in response to signals generated by voltage detector circuit 203; and a frequency multiplier/divider circuit 206, which either divides or multiplies the oscillation frequency generated by oscillator circuit 204. When a multiply factor or a divide factor is one, the frequency multiplier/divider circuit functions as transmission line. In this case, therefore, the frequency multiplier/divider circuit can be neglected. When switching circuit 205 turns off the oscillation frequency, a predetermined dc voltage is output in place of the oscillating signal.

Alternatively, voltage detector circuit 203 may compare the voltages of a voltage reference with main power supply 202. For example, the voltage comprising a voltage reference, $V_{REF}$, is a battery voltage multiplied by a constant value, which is preferably about 1.2 to 1.4 in the case of VDD=5V and $V_{BAT}$=3V, or a predetermined voltage through the employment of a zener diode. In a further alternative, voltage detector circuit 203 may compare the voltages of battery 201, and of a voltage reference with main power supply 202.

Normally real-time clock module 2, which maintains the time and/or calendar function, must receive accurate frequency signals from oscillator circuit 204 and continue to keep time 24 hours a day. For this reason, both the oscillator circuit 204 and real-time clock module 2 are backed up by a battery 201. During battery backup operation, system 4 does not supply clock information to any of the frequency synthesizers 11–16. Therefore, output from switching circuit 205 to the external board is stopped in order to conserve the power of battery 201. Therefore, during the backup operation the current consumption of real-time clock module 2 remains extremely low, at 0.3 to 0.4 µA.

Power On Procedure

The following explains how system 4 runs when the power is turned on. When main power supply 202 is turned on for CPU 5 and the various units of system 4, and the voltage rises from zero to a required level, voltage detector circuit 203 compares the voltages of battery 201 with main power source 202. When or after the voltage of main power supply 202 exceeds the voltage of battery 201 or a prescribed voltage in voltage detector circuit 203, or both, a signal from voltage detector circuit 203 activates switching circuit 205. As a result, a clock is output from oscillator circuit 204 to the external board through output terminal 3. FIG. 17 illustrates an embodiment of voltage detector 203 comprising main power supply 202 having a voltage, VDD, greater than both the voltage, $V_{BAT}$, of battery 201, and a predetermined voltage, $V_{REF}$, which is $V_Z \times (R_1+R_2)/R_2$. COMPARATOR1 compares the voltage of main power source, VDD, and the battery voltage, $V_{BAT}$ and COM-PARATOR2 compares the fractional voltage of main power source, $VDD \times R_2/(R_1+R_2)$, and the voltage, $V_Z$, set by the zener diode. The result of these two comparisons are provided, via an AND gate, as the output of voltage detector circuit 203. With reference to FIG. 18, if $V_{BAT}$ is greater than $V_{REF}$, voltage detector circuit 203 produces an output signal indicative that main power supply 202 is turned on, when the voltage of main power supply 202 exceeds $V_{BAT}$. If $V_{BAT}$ is less than $V_{REF}$, due to degradation or loss of voltage level of battery 201, voltage detector circuit 203 produces an output signal indicative that main power supply 202 is turned on, when the voltage of main power supply 202 exceeds $V_{REF}$.

As shown in FIG. 1, it is possible to output a common 16 MHz frequency from frequency synthesizer 13a to bus control unit 7 and CPU 5. Likewise, it is also possible to output different frequencies, 32 MHz and 25 MHz, from frequency synthesizer 15b to VGA unit 9. In this case, frequency synthesizer 15b contains two PLL circuits. Frequency synthesizers that contain multiple PLLs are able to output several frequencies, one output frequency per PLL. It is also possible to have a frequency synthesizer including only one PLL circuit (e.g., for the highest) and outputting several frequencies obtained by means of frequency dividers instead of employing plural PLLs.

The supply system of this invention can also be used in electronic devices other than a computer. It is especially useful in systems that require several clocks.

According to the above configuration, a clock is supplied for the entire system at a low frequency and only during computer operation. The result is low power consumption. Further, because adjacent components in the system utilize a common operating clock, the configuration allows the use of the minimum necessary number of frequency synthesizers. This feature permits considerable system size reductions.

Embodiment 2

Figure 2:
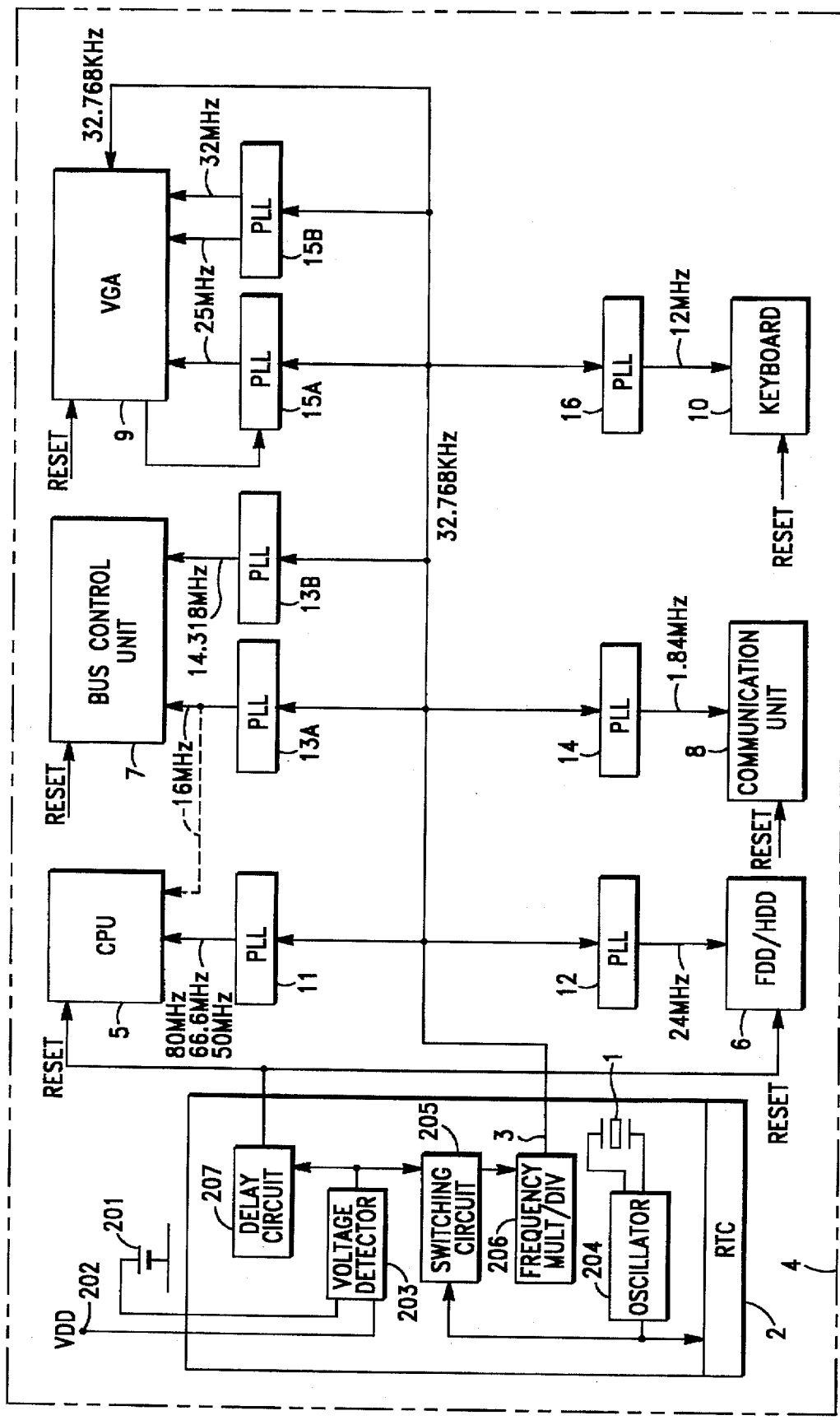
FIG. 2 is a system block diagram illustrating a computer representing another embodiment of this invention.

Referring to FIG. 2, any of the units that require resetting from among CPU 5 and other units, numbered 6–10, that comprise the computer, are reset by the RESET signal. Resetting occurs after the output frequencies of frequency synthesizers 11–16 have become stable. The reset process involves comparing by means of voltage detector circuit 203, the voltages of battery 201 with main power supply 202 and finding that the voltage of main power supply 202 exceeds (in one embodiment) the voltage of battery 201, or exceeds (in another embodiment) the predetermined voltage level set in voltage detector circuit 203. Using a signal from voltage detector circuit 203 as a starting point, a delay time is measured by a delay circuit 207, before a transition in the RESET signal occurs. The accuracy of delay time can be enhanced by using clocks from oscillator circuit 204. FIG. 15 shows the relationship between the RESET signal, the output of voltage detector circuit 203, battery 201, and main power supply 202. FIGS. 16A–16B show an illustrative example of the structure and operation of the delayed reset means. A CR oscillator is employed as a clock source. A signal of a constant period, obtained through CR oscillation, is divided by a ripple counter to obtain a delay time. A flip flop, which has been set in its reset state, is set by a $Q_n$ output of the ripple counter, whereby a reset signal is generated.

The above configuration permits an accurate control of delay signals from the time the power is turned on, during system startup. This permits an accurate, high-speed system startup.

Embodiment 3

Figure 3A:
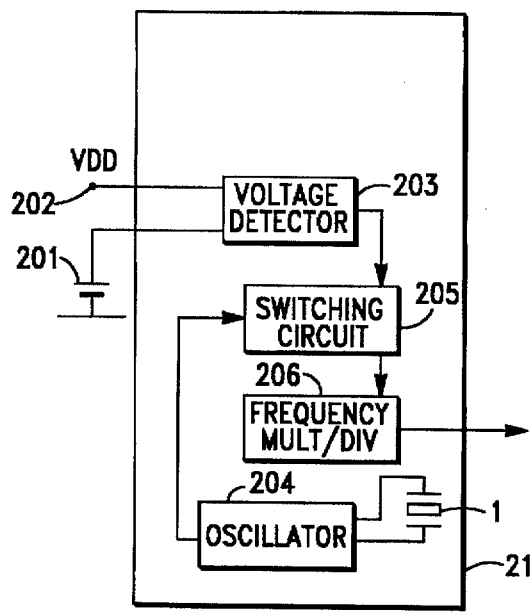
FIG. 3A is a block diagram of a clock oscillator module.
Figure 3B:
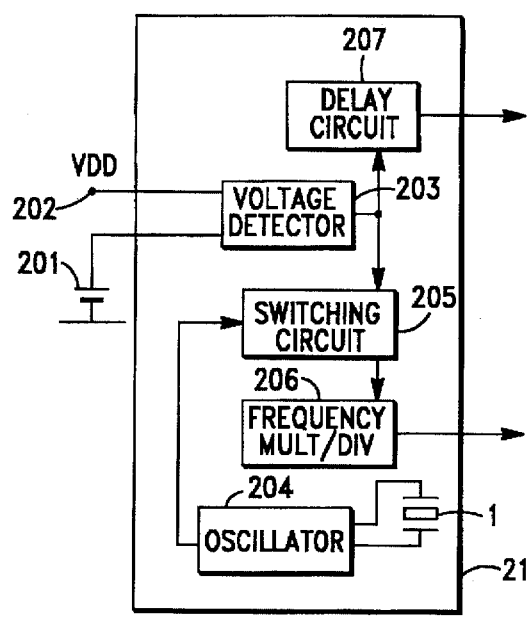
FIG. 3B is a block diagram of another clock oscillator module.

FIGS. 3A–3B show an example wherein a clock oscillator 21 is used instead of a real-time clock module. As in the case of FIGS. 1 and 2, clock oscillator 21 contains a quartz crystal 1 and an oscillator circuit 204 that oscillates quartz crystal 1. Together, quartz crystal 1 and an oscillator circuit 204 generate a 32.768 KHz frequency clock signal. This system supplies a 32.768 KHz clock signal to the PLL circuit-containing frequency synthesizers (not shown; similar to the frequency synthesizer shown in FIGS. 1 and 2) for the system.

The above configuration permits the use of a single, low-cost, low-frequency quartz crystal (for a 32.768 KHz frequency). This reduces the overall cost of the system and decreases the density of components that are mounted on the circuit board. The result is an increased flexibility in board layout.

Embodiment 4

Figure 4:
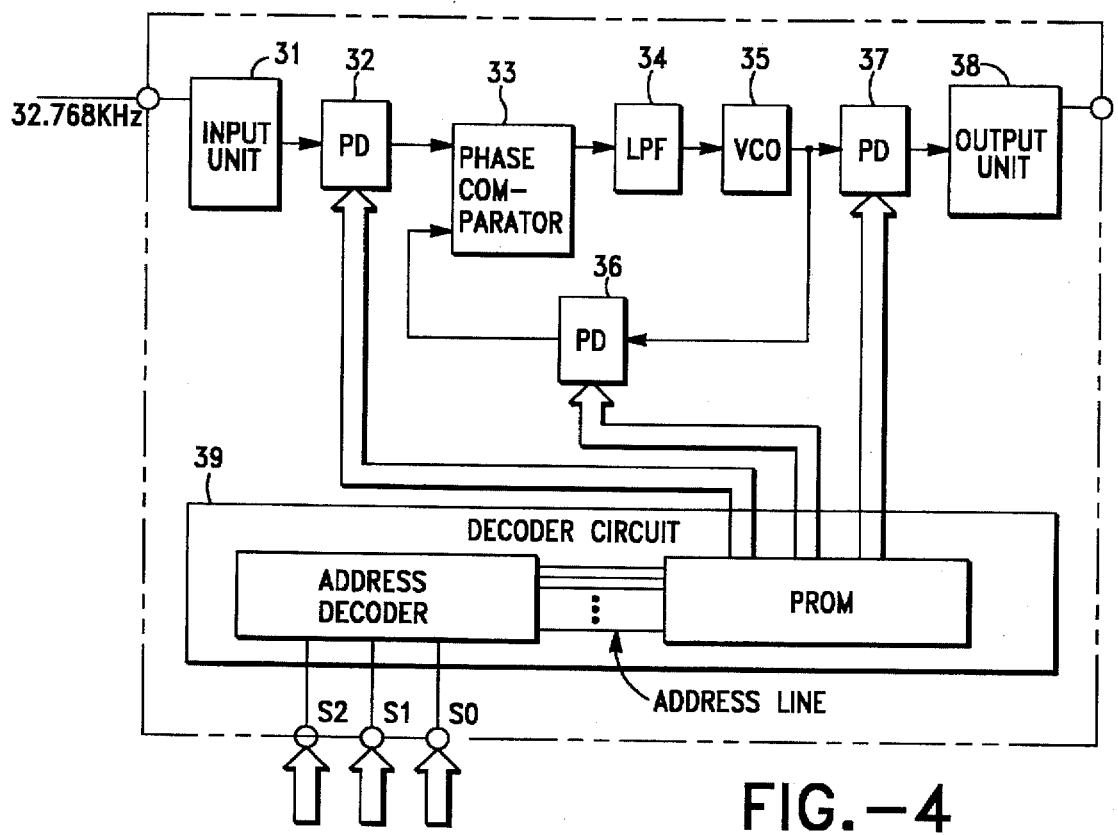
FIG. 4 is a functional block diagram showing a frequency synthesizer containing a PLL according to this invention.

FIG. 4 is a functional block diagram showing an embodiment of a frequency synthesizer that contains a PLL circuit according to the present invention. A 32.768 KHz clock signal is input from a clock input unit 31. The output of clock input unit 31 is received by a first programmable divider (PD) 32, the output of which is coupled to phase comparator 33. The output of phase comparator 33 is coupled to a low-pass filter 34, and the output of low-pass filter 34 is coupled to voltage-controlled oscillator (VCO) 35. The output of VCO 35 is received by a third PD 37 for processing, and the output of PD 37 is transmitted to an output unit 38. The output of VCO 35 is also received by a second PD 36. The output of PD 36 is coupled to an input of phase comparator 33.

First PD 32 divides the output from clock input unit 31, using a predetermined division factor. Phase comparator 33 generates an output signal voltage proportional to phase differences between the inputs to phase comparator 33. Low-pass filter 34 attenuates the high-frequency components of an input signal so that these components are substantially absent from an output signal. Similarly, VCO 35 is capable of varying frequencies according to the output voltage of low-pass filter 34.

Second PD 36 divides the output from VCO 35 by a specified division factor, and supplies the results as a second input for phase comparator 33. The above is the fundamental configuration of the PLL for frequency synthesizer 30.

External inputs, via terminals, S0, S1 and S2, activate decoder circuit 39. Decoder circuit 39 includes an address decoder connected by address lines to a programmable ROM (PROM), the output of which is connected PDs 32, 36 and 37. A mask ROM, fuse ROM or an EEPROM may be employed instead of a PROM. Decoder circuit 39 regulates the operation of first, second and third PDs 32, 36, 37, in order to selectively vary the output frequency present at output unit 38. Thus, through selection of appropriate signals to terminals, S0, S1, and S2, of decoder circuit 39, it is possible to switch among different selectable frequencies and select an output frequency having a stable oscillation of at least one frequency.

The configuration of FIG. 4 permits the input of frequency-setting signals from an external source thereby permitting the construction of frequency synthesizers using common built-in integrated circuits. This also permits the realization of a small, inexpensive frequency synthesizer because only a minimum required number of PLLs are employed.

Embodiment 5

Figures 5, 7:
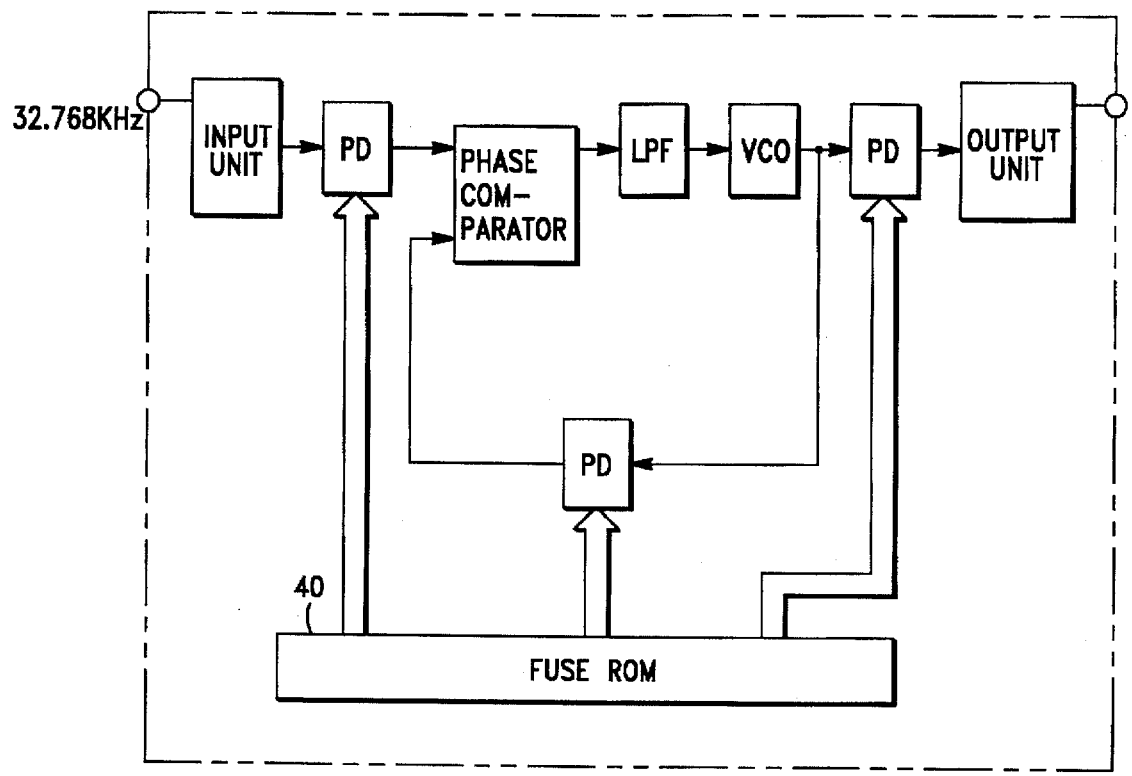
FIG. 5 is a functional block diagram showing another frequency synthesizer containing a PLL according to this invention.
FIG. 7 is an output frequency table.

FIG. 5 is a functional block diagram showing another embodiment of a frequency synthesizer that contains PLL circuits. This configuration is obtained by replacing decoder circuit 39 in FIG. 4 by a fuse ROM circuit 40. "Fuse ROM" refers to a ROM made by connecting n fuses. This type of ROM is referred to as n-bit fuse ROM. The input of a voltage from an external source disconnects the fuses that are configured inside fuse ROM circuit 40. This selects and fixes the output frequency in order to obtain a stable oscillation of at least one frequency.

In this configured synthesizer, therefore, the output frequency is pre-defined and pre-fixed so that the terminals, S0, S1 and S2 are not required and the use of an address decoder circuit, shown in FIG. 4, is not necessary. This permits the use of common circuit board interconnections for different units. The result is a substantial reduction in the amount of design work that is required and the simplicity of output frequency determination to a single frequency reduces the overall cost of the frequency synthesizer. A mask ROM, PROM or EEPROM may be employed instead of a fuse ROM.

Three programmable dividers are shown in FIGS. 4 and 5, and they may not be all necessary in certain cases of desired frequency selections but are preferred to cover all frequency selection possibilities particularly when considering cost effective, mass manufacturing of such frequency synthesizers. In any case, examples of such situations are given later in connection with the explanation of FIG. 7.

Embodiment 6

FIG. 6 is a structural diagram showing an embodiment of a frequency synthesizer that contains PLL circuits. PLL IC 41 containing the functional block shown in FIG. 4 is mounted on the island 42. The pads for PLL IC 41 and the lead terminals that surround island 42 in all directions are wired using gold (Au) wires 43. The above components are molded using resin mold materials.

The terminals of PLL IC 41 are a gate terminal 44, which receives the input of a 32.768 KHz reference clock signal; an S0 terminal 45, an S1 terminal 46, an S2 terminal 47, and a power-down/output-enable control terminal 48, which receive the input of frequency setting signals from external sources; an OUT terminal 49, which outputs a specified frequency; a VDD terminal 50; and a VSS terminal 51.

Methods of controlling the input signals for the S0 terminal 45, S1 terminal 46, and S2 terminal 47 that receive the input of frequency-setting signals include: a DIP switch-based method, illustrated in FIGS. 12A–12C; a circuit board pattern method, illustrated in FIGS. 13A–13B; a jumper wire method, illustrated in FIG. 14; and a controller-based control method (not shown) wherein a controller with a memory program, which may be part of CPU unit 1 or VGA unit 9, provides a selected input, "0" or "1", to terminals S0, S1, and S2.

The DIP switch-based method involves applying input signals by connecting a DIP switch to S0 terminal 45, S1 terminal 46, and S2 terminal 47 to provide the input of frequency-setting signals. FIGS. 12A–12C show examples of DIP switch configurations used in the DIP switch based method. FIG. 12A shows the separate DIP switches accompanied with pull-up resistances for outside connection to voltage supply, VDD. VDD can be supplied directly to decoder circuit 39, in which case, these pull-up resistances would be part of the decoder circuit and, therefore, absent from FIG. 12A. FIG. 12B is a table of the applied signals to terminals, S0, S1 and S2, of respective signal values, 1,0,1, which is a selection of the 50.0 MHz frequency, as will be evident in connection with the later explanation of FIG. 7.

FIG. 12C illustrates that the DIP switch method may employ a three pole type DIP switch. Separate switches that control input signals can also be used instead of a DIP switch.

The circuit board pattern method, shown in FIG. 13A, involves designing a circuit board pattern in advance in order to obtain the desired frequency and applying signals to S0 terminal 45, S1 terminal 46, and S2 terminal 47 that receive the input of frequency-setting signals for the frequency synthesizers. FIG. 13B is a table of the applied signals to terminals S0, S1 and S2 of respective signal values, 1,0,0, which is a selection of the 40.0 MHz frequency, as will be evident in connection with the later explanation of FIG. 7.

The jumper wire-based method, shown in FIG. 14, involves using jumper wires and other conducting materials, such as by soldering, in order to apply signals to S0 terminal 45, S1 terminal 46, and S2 terminal 47 that receive the input of frequency-setting signals. FIG. 14 shows one such jumper which is the same for each of the terminals. Here, a signal, high or "1", is illustrated as one of the respective signals, S0, S1 or S2. If VDD is supplied internally to decoder circuit 39, then, the jumper wire for VDD, shown in FIG. 14, would not be needed via selection outside the circuit. On the other hand, a signal, low or "0", could be selected in such a case by means of a jumper wire to the ground terminal shown in FIG. 14.

In the following detailed explanation of a control function based on the use of power-down/output-enable control terminal 48, positive logic (high=1, low=0) is used.

The power-down function is designed to achieve an overall reduction in the system's power consumption by halting the operation of PLL IC 41. When power-down control terminal 48 is high, PLL IC 41 continues to run, and when it is low, the operation of PLL IC 41 ceases, and output halts. For example, in FIG. 1, to power down VGA unit 9, power-down control terminal 48 for either frequency synthesizer 15a or 15b is made low by means of a control signal from VGA unit 9.

The output enable function allows the selection of the state of PLL IC 41 in terms of either an output state or a high impedance. When output enable terminal 48 is high, for example, the clock assumes the output state. When terminal 48 is low, the high impedance is assumed. As in the case of the power-down terminal, the output enable terminal can be controlled by means of control signals from the various units.

In the above embodiment, both the power-down and output enable functions of PLL IC 41 are wired in the same terminal. In this case, both the power-down and output enable functions are controlled simultaneously. However, it is not necessary that the wiring be limited to this embodiment, and the two functions can be wired and controlled independently.

The above configuration permits the input of frequency-setting signals from external sources, and this enhances the general applicability of the system. Also, it is possible to control the power-down and output enable functions for each frequency synthesizer.

Embodiment 7

FIG. 7 shows an output frequency table for the frequency synthesizer that contains a PLL circuit and that is used in the clock supply system of the invention, such as shown in FIG. 4. By controlling the binary signal applied to each of terminals S0, S1, and S2 of frequency synthesizer 30, one of eight different, selected frequency options can be provided at the frequency synthesizer output, to wit, 1.8432 MHz, 14.318 MHz, 16 MHz, 24 MHz, 40 MHz, 50 MHz, 66.6 MHz, or 80.0 MHz. The selected frequency, $f_0$, is calculated according to following equation:

$$f_0 = f_{REF} \cdot N/M \cdot 1/X,$$

where $f_{REF}$ is the reference frequency (32.768 KHz), M is dividing factor of first PD 32, N is the dividing factor of second PD 36 and X is the dividing factor of third PD 37. The values M, N, and X are written in decoder circuit 39. For the 8 frequency options mentioned above, the values for M, N and X would respectively be (1, 900, 16); (1, 1748, 4); (1, 1953, 4); (1, 1465, 2); (1, 2441, 2); (1, 3052, 2); (1, 4069, 2); and (1, 4882, 2). As an example, when the frequency of 1.8432 MHz is required, S0, S1 and S2 are respective set to a binary value "0". As a result of decoding, M is set to 1 (binary=0, 1), N is set to 900 (binary=0,0,0,1,1,1,0,0,0,0,1, 0,0,), and X is set to 16 (binary=1,0,0,0,0). This binary data is supplied from the PROM in decoder circuit 39.

Moreover, by increasing the number of terminals that receive frequency-setting signals to four, it is possible to provide 16 frequency options (a corresponding frequency table is not shown). In this case, the following frequencies, as an example, can be selected: 1.843, 14.318, 16, 20, 22.11, 24, 25, 32, 33.3, 40, 48, 50, 66.6, 75, 80, and 100 MHz. These frequencies are commonly used in computer systems.

As noted above, the above configuration permits the selection of a desired frequency from an output frequency table, thus enhancing the general applicability of the system.

Also, in the case of a mask ROM, for example, by selectively providing masks for selected metal (typically aluminum) interconnections to accommodate several output frequency tables, it is possible to provide many different frequencies via the mask ROM. In other words, by reprogramming decoder circuit 39 of frequency synthesizer 30 to output different control signals, the programmable dividers 32, 36, 37 can be set to operate with many different combinations of dividing factors. In this manner, a large number of frequencies may be selected. Referring to the architecture of frequency synthesizer 30, it can be seen that the output frequency equals the reference frequency divided by the dividing factor of PD 32, multiplied by the dividing factor of PD 36, and divided by the dividing factor of PD 37.

As previously mentioned, three programmable dividers, shown in FIGS. 4 and 5, may not be all necessary in certain cases of desired frequency selections. For example, PD 32 is not necessary when the reference frequency, $f_{REF}$, is 32 KHz because the value for M is 1. However, PD 32 is necessary for precisely setting the desired output frequency in the case where the reference frequency, $f_{REF}$, is high value or is provided in fine frequency steps. PD 36 is necessary for determining the multiplication factor of $f_{REF}$. PD 37 is not necessary in determining the desired frequency, $f_0$. However, in actuality, when the frequency of the VCO 35 is high, the output signal can shift so that it is desired to have a signal of 50% duty cycle which is achieved by dividing, i.e., by setting X equal to 4, 8, 16, 22, etc., so that a low frequency output signal can be provided even when the oscillation frequency of the VCO 35 is not wide.

Embodiment 8

Figure 8:
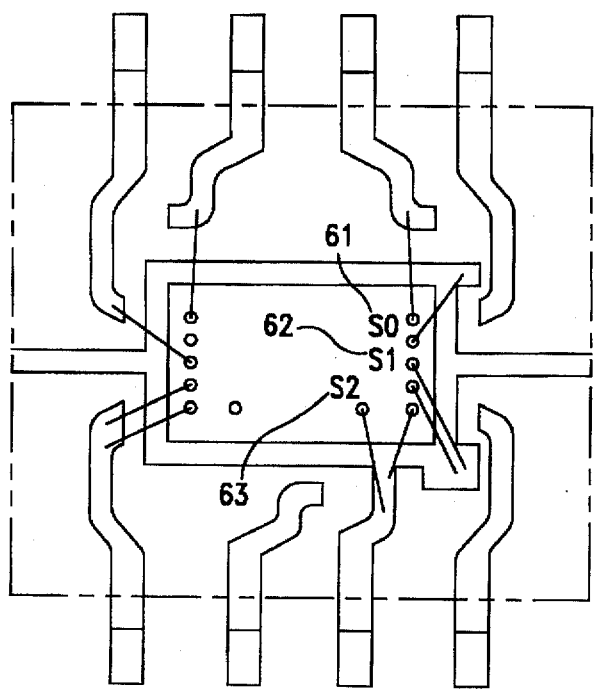
FIG. 8 is a structural diagram showing another frequency synthesizer containing a PLL according to this invention.
Figure 11:
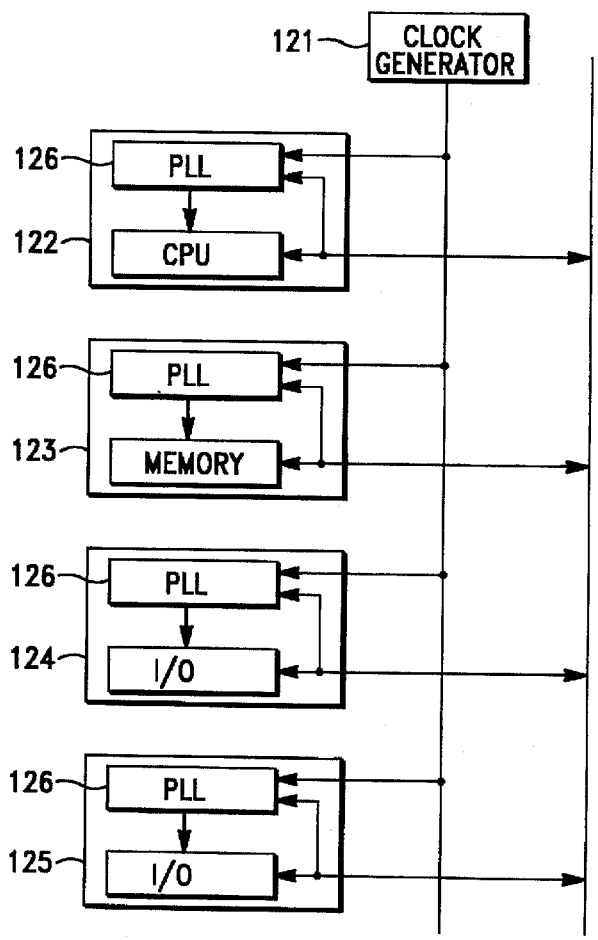
FIG. 11 is a system block diagram known in the art.
Figure 10:
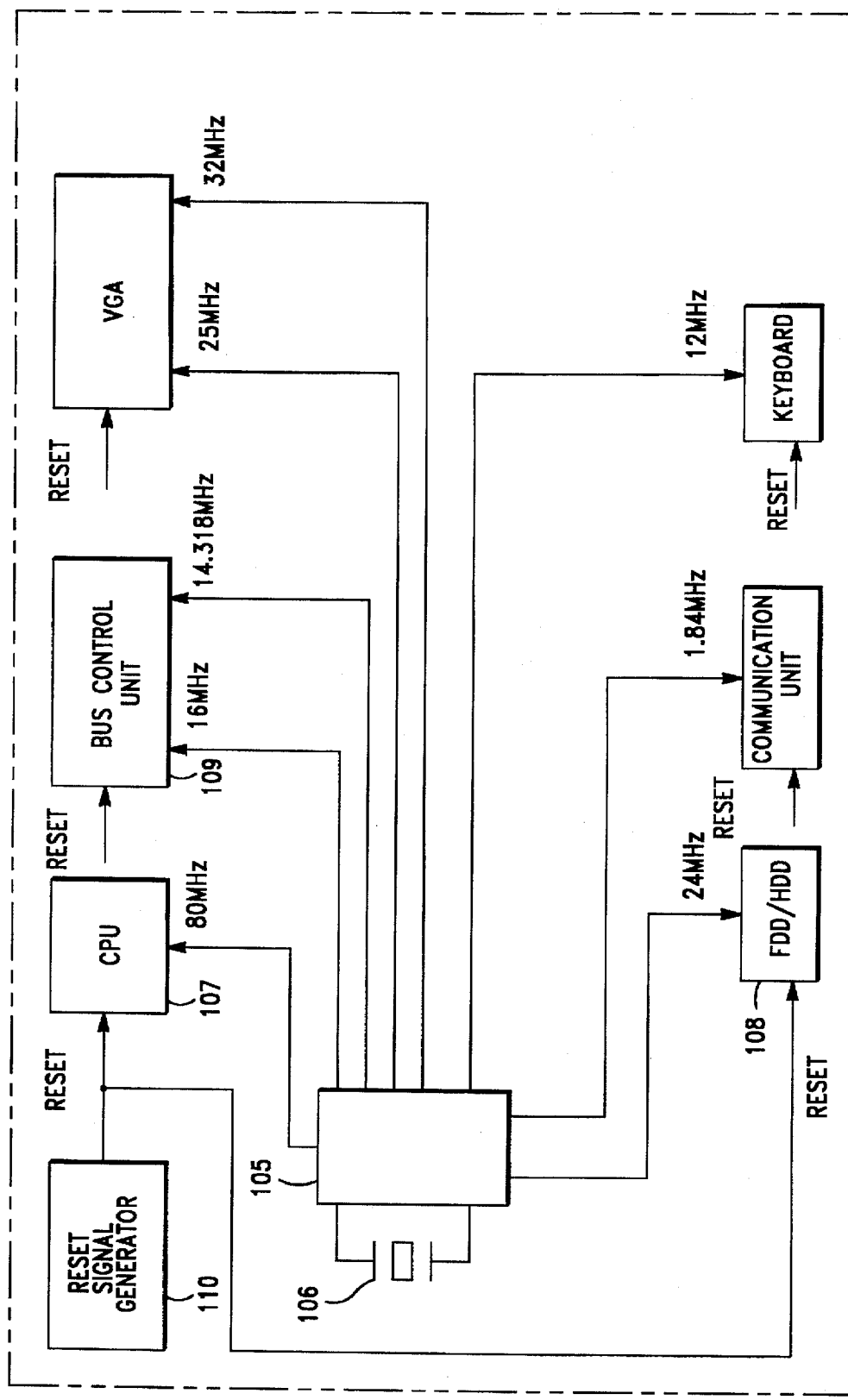
FIG. 10 is a system block diagram known in the art.

FIG. 8 is a structural diagram of a frequency synthesizer that has PLL circuits according to the invention. In this embodiment, terminals S0 61, S1 62, and S2 63 are used to determine the selection of the output frequency of the frequency synthesizer. Terminals S0 61, S1 62, and S2 63 are normally high because they are connected internally to VDD through a pull-up resistor. In order to set any of terminals S0 61, S1 62, and S2 63 to a low level, that terminal is connected to VSS by a bond wire. Bond wires are typically made of gold (Au), although other conductive materials such as aluminum could be used. In this embodiment output frequencies similar to the frequency-setting table of FIG. 7 can be selected.

The above configuration involves output frequencies that are fixed in advance. This allows the use of common circuit board wiring for different units, and substantially reduces the mount of design work that is required. This configuration also allows for a compact implementation of frequency synthesizers containing PLL circuits providing for a reduction in the size of the system.

Benefits of the Invention

The present invention allows the propagation of a common, low-frequency (e.g., 32.768 KHz) clock that is output from either a real-time clock module or a clock oscillator to the entire system, including the CPU, FDD/HDD unit, bus control unit, and VGA unit, in a stable manner as a single operating clock. This permits the startup of the entire computer in a stable, accurate manner. Because the required clock signal is a low-frequency (e.g., 32.768 KHz) clock signal, even in cases where the length of interconnections on the circuit board is increased, the amount of EMI radiation escaping to the outside world remains extremely low. This ensures a stable propagation of operating clocks. The extremely low level of electromagnetic radiation to the external board keeps noise insulation measures simple, and this facilitates efforts to achieve size reductions in the computer.

As a further advantage, only one piezoelectric resonator for the entire unit is required, and this resonator can be an inexpensive, low-frequency resonator (e.g., 32.768 KHz). This reduces the overall cost of the system, reduces the packing density of circuit boards and other components, and thus enhances the flexibility in mount layout.

Further, all frequency synthesizers containing PLL circuits according to the present invention can use common integrated circuits. This also permits the realization of a small, inexpensive frequency synthesizer, because only the minimum required number of PLLs are used. Also, the frequency synthesizers containing PLL circuits can be controlled from outside on a common basis. This enhances the general applicability and greatly simplifies the configuration of the clock system incorporating these frequency synthesizers.

According to the clock system of this invention, clocks that are input to the PLL circuit can be of a low-frequency variety (e.g., 32.768 KHz). Compared with conventional oscillator circuits that output clocks in the 10 MHz range, this reduces the oscillation power consumption approximately in proportion to the required frequency. This results in an extremely low power consumption, and helps to reduce the power consumption of the entire system. Further, the reduced power consumption during oscillation reduces the amount of heat generated. This permits the provision of PLL circuit-containing frequency synthesizers and provision of clock systems of high reliability.

By designing the drive voltage for the PLL circuit in the 3V–5V range, instead of relying on the voltage of the output line for the clock signal, frequency synthesizers containing PLL circuits using the same components can accommodate the drive voltages of various units of the computer. Compared with the conventional piezoelectric oscillator that required the creation of a new IC chip for each drive voltage, this significantly reduces the system's delivery lead time and developmental costs. Thus, this easily accommodates systems containing both 3V and 5V devices.

Also, because the I/O pins for frequency synthesizers containing PLL circuits can all be common, circuit board interconnections for different units can be provided on a common basis. This substantially reduces the mount of required design work.

The frequency synthesizers containing PLL circuits according to the present invention, can be fabricated as standard components. Compared with conventional piezoelectric oscillators and multi-output oscillators that can be manufactured only after the desired output frequency is determined, the new frequency synthesizers substantially reduce fabrication lead time.

Whereas in conventional multi-output oscillators a single difference in the system's frequency requires a change in the ICs for the multi-output oscillator, the frequency synthesizer containing PLL circuits of this invention are capable of producing either 8 or 16 frequencies for each of the computer units. This enhances the general applicability and flexibility in system design. If any other frequencies are needed, frequencies for any operating clock can be obtained by modifying the masks for the metal interconnection of the IC.

Further, because the frequency synthesizer containing PLL circuits do not need to contain a built-in piezoelectric resonator, a further reduction in the size and height of the frequency synthesizer is made possible. Moreover, because the 32.768 KHz frequency is a clock signal that can be provided as an input directly into a VGA unit, cost reduction can be realized due to a reduction in the require number of parts.

By using the above clock supply system, it is possible to achieve cost reductions, power reductions, and down-sizing in computers and electronic devices that require multiple operating clocks.

In cases where reset signals for the CPU need to be controlled, and according to the control method of the present invention which accurately controls the delay signals from the power-up time during the startup of the entire system, it is possible to achieve accurate, reliable system startup for high-speed operations.

Lastly, because clocks are supplied to the entire system on a low-frequency basis and only during computer operation, there is a reduction in power consumption, and this prolongs battery life.

While the invention has been described in conjunction with several specific embodiments, it is evident to those skilled in the art that many further alternatives, modifications and variations will be apparent in light of the foregoing description. For example, the reset signal may be a pulse of a predetermined width, rather than a level transition as found in positive or negative edges. Thus, the invention described herein is intended to embrace all such alternatives, modifications, applications and variations as may fall within the spirit and scope of the following claims.

APPENDIX I 1 quartz crystal resonator
2 real-time clock module
3 output terminal
4 system
5 CPU unit
6 FDD/HDD
7 bus control unit
8 communication unit
9 VGA unit 10 keyboard unit
11, 12, 13a–13b, 14, 15a–15b, 16, 30 frequency synthesizer
21 clock oscillator
31 clock input unit
32, 36, 37 programmable divider
33 phase comparator
34 low-pass filter
35 VCO
38 output unit
39 decoder circuit
40 fuse ROM circuit
41 PLL IC
42 island
43 Au wire
44 gate terminal
45 S0 terminal
46 S1 terminal
47 S2 terminal
48 power-down/output-enable control terminal
49 OUT terminal
50 VDD terminal
51 VSS terminal
61 S0 terminal
62 S1 terminal
63 S2 terminal
101 quartz oscillator
102 CPU
103 FDD/HDD unit
104 bus control unit
105 multi-output oscillator
106 quartz crystal
107 CPU
108 FDD/HDD unit
109 bus control unit
110 RESET signal circuit
121 clock generator circuit
122, 123, 124, 125 IC
126 phase locked loop circuit
201 battery
202 main power supply
203 voltage detector circuit
204 oscillator circuit
205 switching circuit
206 frequency multiplier/divider circuit
207 delay circuit

What is claimed is:

1. A clock generation and distribution network for driving plural synchronous devices, comprising:
   a nonvolatile voltage source generating a first voltage signal;
   a real-time clock module, comprising:
      an oscillator circuit coupled to said nonvolatile voltage source, said oscillator including a quartz crystal for generating a continuously oscillating signal upon application thereto of the first voltage signal, the oscillating signal oscillating at a first frequency less than 100 KHz; and
      a frequency multiplier/divider circuit coupled to said oscillator circuit including means for generating a reference clock based on the oscillating signal; and
   a plurality of separately-housed frequency synthesizers in communication with said frequency multiplier/divider circuit of said real-time clock module, each said frequency synthesizer including a phase locked loop clock multiplier having a programmable memory for generating a local clock signal based on the reference clock and contents of said programmable memory, the local clock signal being routed to at least one of the synchronous devices.

2. The clock generation and distribution network of claim 1, wherein the first frequency of the continuous signal approaches 32.768 KHz.

3. The clock generation and distribution network of claim 1, wherein said nonvolatile voltage source comprises a battery.

4. The clock generation and distribution network of claim 1, wherein said nonvolatile voltage source comprises a zener diode controlled voltage source.

5. The clock generation and distribution network of claim 1, wherein said real-time clock module further comprises a reset circuit coupled to at least a resettable one of the synchronous devices to selectively issue a reset signal to the resettable synchronous device.

6. The clock generation and distribution network of claim 5, wherein said real-time clock module further comprises a delay circuit including means responsive to said oscillator circuit for causing said reset circuit to issue the reset signal only upon expiration of a predetermined time period based on the oscillating signal to insure stability of the reference clock signal when the reset signal is received by the resettable synchronous device.

7. The clock generation and distribution network of claim 1, further comprising a volatile main power supply; and
   wherein said real-time clock module further comprises a voltage detector coupled to said nonvolatile voltage source and said main power supply, comprising:
      determining means for determining whether a second voltage signal generated by said main power supply exceeds the first voltage signal for at least a predetermined period of time; and
      detection signal assertion means responsive to said determining means for asserting a detection signal when the second voltage signal exceeds the first voltage signal as determined by said determining means.

8. The clock generation and distribution network of claim 7, wherein
   said real-time clock module further comprises a switching circuit coupled between said oscillating circuit and said frequency multiplier/divider circuit, said switching circuit being responsive to said voltage detector detection signal assertion means for transmitting one of:
      said oscillating signal to said frequency multiplier/divider circuit when the detection signal is asserted; and
      a predetermined dc signal to said frequency multiplier/divider circuit in absence of the detection signal for selectively disabling the reference clock.

9. The clock generation and distribution network of claim 8, wherein said real-time clock module further comprises a reset circuit coupled to said voltage detector and at least a resettable one of the synchronous devices to issue a reset signal to the resettable synchronous device upon assertion of the detection signal.

10. The clock generation and distribution network of claim 9, wherein said real-time clock module further comprises a delay circuit coupled to said voltage detector and said reset circuit, said delay circuit including means responsive to said oscillator circuit for causing said reset circuit to issue the reset signal only after assertion of the detection signal for at least a predetermined time period based on the oscillating signal to insure stability of the reference clock signal when the reset signal is received by the resettable synchronous device.

* * * * *